United States Patent
Aratake et al.

(10) Patent No.: US 7,358,652 B2
(45) Date of Patent: Apr. 15, 2008

(54) SURFACE MOUNT TYPE PIEZOELECTRIC VIBRATOR, OSCILLATOR, ELECTRONIC DEVICE, AND RADIO CLOCK

(75) Inventors: Kiyoshi Aratake, Chiba (JP); Keiji Sato, Chiba (JP)

(73) Assignee: Seiko Instruments Inc. (JP)

( * ) Notice: Subject to any disclaimer, the term of this patent is extended or adjusted under 35 U.S.C. 154(b) by 17 days.

(21) Appl. No.: 11/326,142

(22) Filed: Jan. 5, 2006

(65) Prior Publication Data
US 2006/0158067 A1 Jul. 20, 2006

(30) Foreign Application Priority Data
Jan. 14, 2005 (JP) ............... 2005-007053

(51) Int. Cl.
H01L 41/053 (2006.01)
H01L 41/047 (2006.01)
(52) U.S. Cl. ...................... 310/340; 310/364
(58) Field of Classification Search ........... 310/340, 310/344, 363, 364, 370
See application file for complete search history.

(56) References Cited

U.S. PATENT DOCUMENTS 5,818,151 A * 10/1998 Takai et al. ............ 310/364
6,111,338 A * 8/2000 Otsuchi et al. ........... 310/352
2002/0075127 A1* 6/2002 Inoue et al. ............. 338/22 R
2003/0122453 A1* 7/2003 Yamada et al. .......... 310/363
2006/0198162 A1* 9/2006 Ishidu et al. ............. 362/623

FOREIGN PATENT DOCUMENTS

KR  2002-049676 A  * 6/2002

OTHER PUBLICATIONS

Patent Abstracts of Japan, publication No. 2000-341065, publication date Dec. 8, 2000.

* cited by examiner

Primary Examiner—Thomas M. Dougherty
(74) Attorney, Agent, or Firm—Adams & Wilks (57) ABSTRACT

A surface mount type piezoelectric vibrator comprises a piezoelectric vibrator piece having an electrode, an airtight container made of glass or a ceramic material for encapsulating the piezoelectric vibrator piece, and an external terminal formed on an exterior surface of the airtight container and connected to the electrode of the piezoelectric vibrator piece. The external terminal comprises a metal alloy of Ni and Cr. A film of Au is formed on a surface of the metal alloy of Ni and Cr.

12 Claims, 5 Drawing Sheets

SURFACE MOUNT TYPE PIEZOELECTRIC VIBRATOR, OSCILLATOR, ELECTRONIC DEVICE, AND RADIO CLOCK

BACKGROUND OF THE INVENTION

1. Field of the Invention

The present invention relates to surface mount type piezoelectric vibrator, oscillator, electronic device, and radio clock. For example, the present invention relates to an electronic device using a surface mount type piezoelectric vibrator or the like, an external electrode of which is composed of an alloy metal of chrome and nickel and which can be soldered again.

2. Description of the Related Art

As an electronic element indispensable for manufacture of an industrial product, there is a quartz crystal vibrator in which a quartz crystal vibrator piece is encapsulated in an airtight container.

A quartz crystal has a property that it expands and contracts due to a piezoelectric effect when a voltage is applied thereto. If the quartz crystal is incorporated in a feedback circuit of a resonance circuit, it carries out very accurate and stable oscillation.

By using this property, a quartz crystal vibrator is used for all electronic products including an electronic device such as a vibrator, an information and communication device, a mobile device, and a home appliance or the like as a clock function and frequency control mechanism.

As a quartz crystal vibrator, there is one of a lead type in which a lead wire is arranged and one of a surface mount type in which a package is directly mounted on a printed board or the like.

Figure 8A:
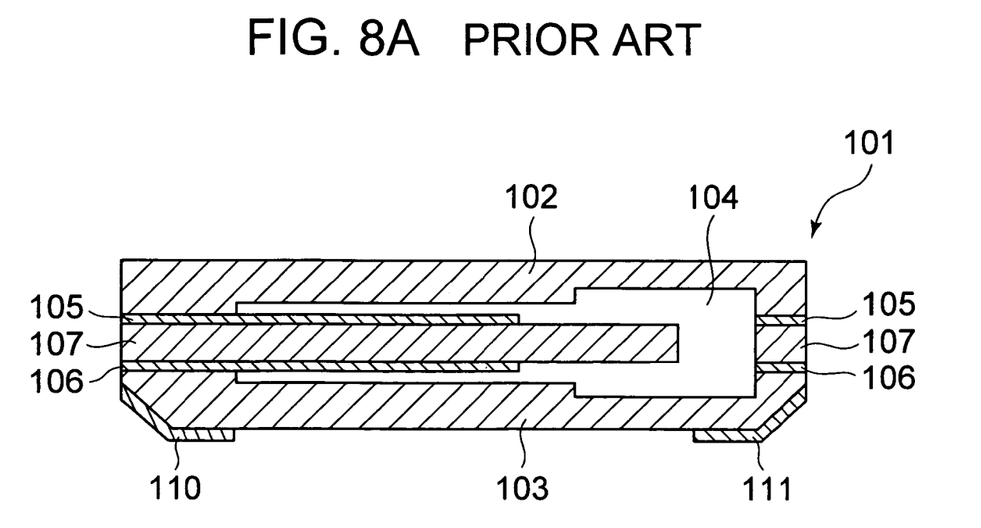
FIG. 8A is a conceptual illustration showing a section in a longitudinal direction of a quartz crystal vibrator of a surface mount type.

FIG. 8A is a conceptual illustration showing a section in a longitudinal direction of a quartz crystal vibrator of a conventional surface mount type. A surface on which an external electrode 110 and an external electrode 111 are formed is a face contacting a printed board.

A quartz crystal vibrator 101 is composed of a lid 102 that is made of a glass member represented by a soda lime glass, a base 103, exciting electrodes 105 and 106 that are made of aluminum or the like, and a quartz crystal vibrator piece 107 or the like.

The exciting electrodes 105 and 106 are formed on front and rear surfaces of the quartz crystal vibrator piece 107 and they are used to apply a voltage to the quartz crystal vibrator piece 107.

At the outer surfaces of the exciting electrodes 105 and 106, the lid 102 and the base 103 are pasted with anodic bonding (to be described in detail in the embodiment) to form a glass package.

On the lid 102 and the base 103, concave portions are formed and these concave portions form a cavity 104 in which the quartz crystal vibrator piece 107 oscillates.

In the vicinity of an end face of a bottom part of the base 103, the external electrode 110 and the external electrode 111 are formed. The external electrode 110 and the external electrode 111 are terminals to solder the glass package on a base.

Although it is not illustrated, the external electrode 110 is connected to the exciting electrode 105 and the external electrode 111 is connected to the exciting electrode 106. Then, if a voltage is applied to the external electrode 110 and the external electrode 111, the voltage is applied to the exciting electrode 105 and the exciting electrode 106, and the quartz crystal vibrator piece 107 can be driven.

Figure 8B:
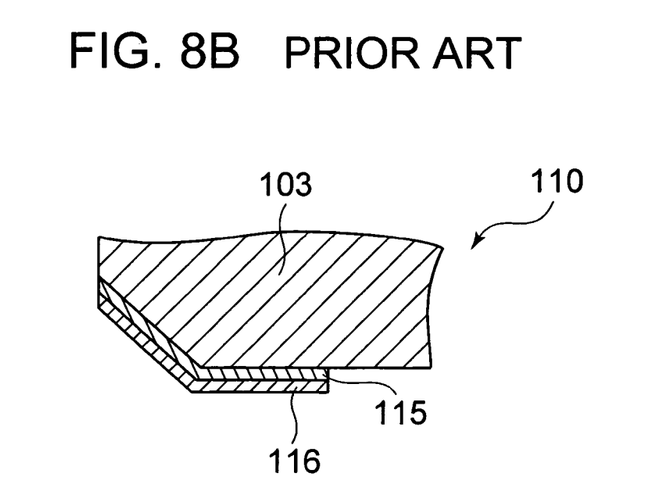
FIG. 8B is an enlarged view of the external electrode.

FIG. 8B is an enlarged view of the external electrode 110. The external electrode 110 is of two-layer structure including a base metal 115 formed on the base 103 and a surface metal 116 formed on the surface of the base metal 115.

The base metal 115 is made of Cr (chrome) and the surface metal is made of Au (gold).

The base metal 115 secures coherence to the glass and the surface metal 116 forms an alloy metal with solder. The structure of the external electrode 111 is the same.

In other words, since Cr sticks to the glass but is not an appropriate metal for soldering, Au that is bonded to Cr and can be soldered is formed on the surface of Cr.

In this way, for the art that relates to a surface mount type of quartz crystal vibrator, there is a method to manufacture a quartz crystal vibrator by the anodic bonding. As a result, the quartz crystal vibrator 101 as shown in FIGS. 8A and 8B is obtained.

There is a demand to detach the quartz crystal vibrator 101 that has been soldered once and solder it again, for example, a demand to conduct an experiment by transferring the same quartz crystal vibrator 101 to a plurality of electronic circuits or the like.

By the way, the surface metal 116 (namely, Au) is diffused in a solder by soldering once because Au has a high diffusion speed into the solder. On the other hand, Cr composing the base metal 115 does not form an alloy metal with the solder.

Therefore, it is difficult to detach the quartz crystal vibrator 101 that has been soldered once and solder it again.

In place of Cr, Ti (titan) may be used, however, Ti does not form the alloy metal with the solder in the same way.

In addition, not in a glass package but in a ceramics package in which an airtight container is constituted of ceramics, Ni (nickel) may be used for the external electrode. However, since Ni has a large stress of film, if this is used for the glass package, the glass may be damaged or the film of Ni may be peeled off.

In addition, if a film thickness of Ni is made thin in order to reduce the stress, Ni is diffused in the solder the same as Au, so that it is difficult to solder Ni again. Particularly, this phenomenon is remarkable in Pb (lead) free soldering.

SUMMARY OF THE INVENTION

Therefore, an object of the present invention is to enable to easily perform soldering again in the soldering of a surface mount type piezoelectric vibrator.

In order to attain the above-described object, the present invention provides a surf ace mount type piezoelectric vibrator, characterized by comprising: a piezoelectric vibration piece on which an electrode is arranged; an airtight container made of a glass or a ceramics for encapsulating the piezoelectric vibration piece; and an external terminal, which is formed at the outside of the airtight container by an alloy metal made of chrome and a predetermined metal that can be soldered and which is connected to the electrode (a first structure).

In the first structure, the predetermined metal can be made of nickel (a second structure).

In addition, in the first structure, an oxidation protection film that can be soldered can be also formed on the surface of the external terminal (a third structure).

It is also possible to use the surface mount type piezoelectric vibrator of any one of the first to third structures as being connected to an integrated circuit as an oscillator (a fourth structure).

In addition, the present invention provides an oscillator, in which a surface mount type piezoelectric vibrator is connected to an integrated circuit as an oscillation piece, wherein the surface mount type piezoelectric vibrator comprises: a piezoelectric vibrator piece on which an electrode is arranged; an airtight container made of a glass or a ceramics for encapsulating the piezoelectric vibrator piece; and an external terminal, which is formed at the outside of the airtight container by an alloy metal made of chrome and a predetermined metal that can be soldered and which is connected to the electrode (a fifth structure).

Further, it is also possible to use the surface mount type piezoelectric vibrator of any one of the first to third structures as being connected to a clock part (a sixth structure).

In addition, the present invention provides an electronic device, in which a surface mount type piezoelectric vibrator is connected to a clock part, wherein the surface mount type piezoelectric vibrator comprises: a piezoelectric vibrator piece on which an electrode is arranged; an airtight container made of a glass or a ceramics for encapsulating the piezoelectric vibrator piece; and an external terminal, which is formed at the outside of the airtight container by an alloy metal made of chrome and a predetermined metal that can be soldered and which is connected to the electrode (a seventh structure).

Further, it is also possible to use the surface mount type piezoelectric vibrator of any one of the first to third structures as being connected to a filter part (a eighth structure).

In addition, the present invention provides a radio clock, in which a surface mount type piezoelectric vibrator is connected to a filter part, wherein the surface mount type piezoelectric vibrator comprises: a piezoelectric vibrator piece on which an electrode is arranged; an airtight container made of a glass or a ceramics for encapsulating the piezoelectric vibrator piece; and an external terminal, which is formed at the outside of the airtight container by an alloy metal made of chrome and a predetermined metal that can be soldered and which is connected to the electrode (a ninth structure).

According to the present invention, in the soldering of the surface mount type piezoelectric vibrator, it is possible to easily perform the soldering again.

BRIEF DESCRIPTION OF THE DRAWINGS

FIGS. 2a and 2b show the structure of a quartz crystal vibrator, where

FIG. 8 is a view for explaining a conventional art, where

DESCRIPTION OF THE PREFERRED EMBODIMENTS (1) Summary of the Embodiment

The external electrode is formed by the alloy metal of Ni and Cr, namely, NiCr. Further, on the surface of NiCr, an oxidation resistant film for oxidation resistance is formed by the film of Au. Therefore, in the structure of the external electrode, the layer of NiCr is formed on the surface of the glass, and further, the layer of Au is formed thereon. Hereinafter, such a layer structure is described as a glass-NiCr—Au or the like.

In the meantime, NiCr and Au are deposited by spattering (a spatter method) to be made into a film of a low stress.

In the external electrode of such a structure, the layer of Au is dispersed in the solder by a first soldering, however, since Cr in NiCr reduces the diffusion speed of Ni into the solder, Ni is remained in the external terminal. Since Ni is a metal to make the alloy metal with the solder, it is possible to perform soldering-again by removing this quartz crystal vibrator.

In this way, when soldering the quartz crystal vibrator according to the present embodiment, Au is dispersed in the solder and secures a wet property and NiCr secures coherence with the glass while making the alloy metal with the solder. Therefore, it becomes possible to solder the quartz crystal vibrator again. Further, the stress due to the external electrode can be reduced so as to enable to reduce the damage of the glass.

(2) Details of the Embodiment

Figure 1:
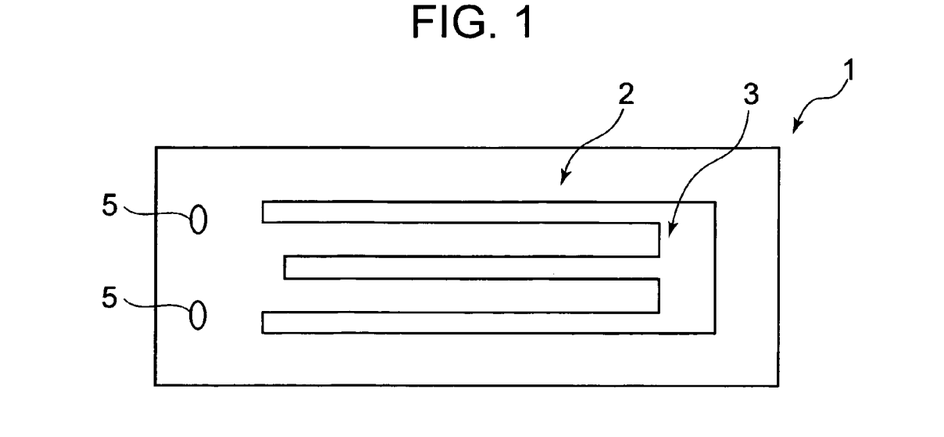
FIG. 1 is a view showing the outline of a quartz crystal vibrator piece.

FIG. 1 shows the outline of the quartz crystal vibrator piece according to the present embodiment.

A quartz crystal vibrator piece 1 is manufactured from a single crystal by a series of steps (a single crystal of a quarts→cutting a wafer at a predetermined angle with a crystal axis→etching). The quartz crystal vibrator piece 1 configures a piezoelectric vibrator piece.

The quartz crystal vibrator piece 1 has a rectangular shape of outline and it is composed of a frame 2 formed along the outer circumference into a ring shape and a tuning fork type of vibrating arm 3 that is formed at a center part.

Although they are different depending on the intended frequency, the outer size of the vibrating arm 3 is about a length 1700 [μm], a width 320 [μm], and a thickness 130 [μm].

The frame 2 and the vibrating arm 3 are integrally formed by etching and a base bottom part of the vibrating arm 3 is bonded to the inner circumference part of the frame 2.

Further, on the frame 2, a through hole 5 is provided so as to introduce the exciting electrode to be formed on the vibrating arm 3 into the external electrode.

Figure 2A:
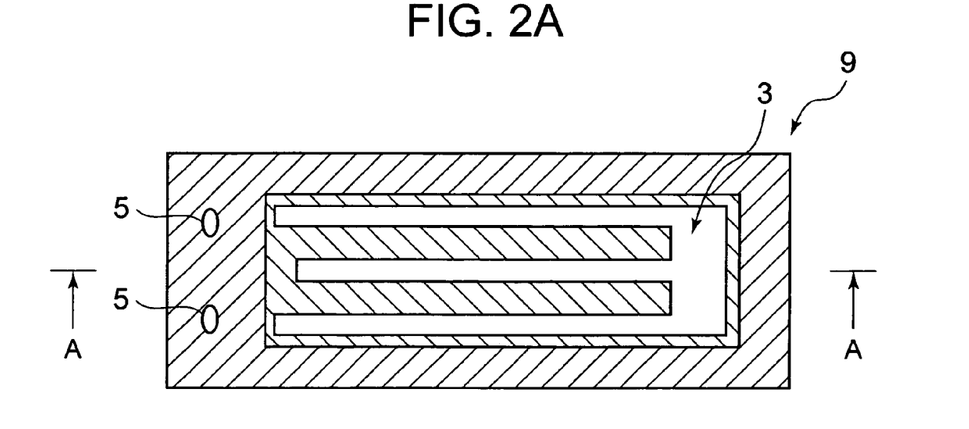
FIG. 2A is a sectional view as seen from an arrow B in FIG. 2B.
Figure 2B:
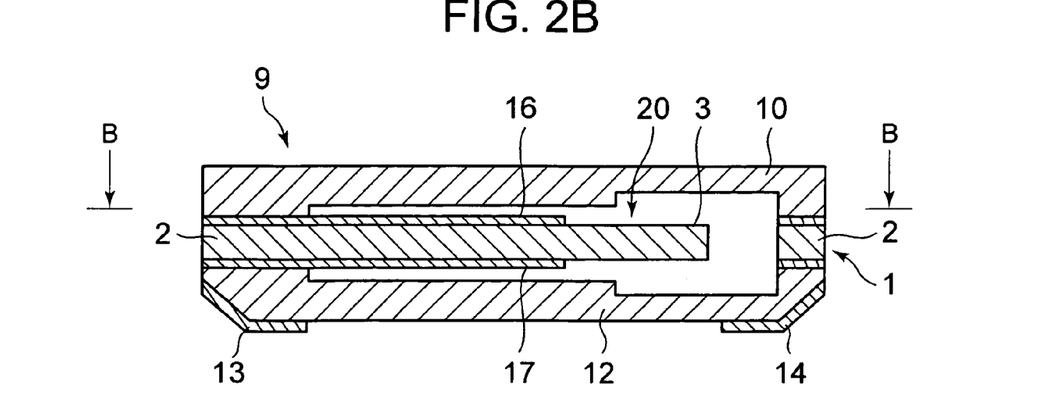
FIG. 2B is a sectional view as seen from an arrow A in FIG. 2A.

FIG. 2 is a diagram for explaining the structure of the crystal vibrator according to the present embodiment.

FIG. 2A is a sectional view as seen from an arrow B in FIG. 2B, and FIG. 2B is a sectional view as seen from an arrow A in FIG. 2A.

A quartz crystal vibrator 9 is composed of a lid 10, a base 12, a quartz crystal vibrator piece 1 made of the frame 2 and the vibrating arm 3, exciting electrodes 16, 17, an external electrode 13, and an external electrode 14 or the like and it configures a surface mount type piezoelectric vibrator.

Any of the lid 10 and the base 12 is configured with the soda lime glass and at the center portions, concave portions are provided.

In the quartz crystal vibrator 9, by arranging the concave portions of the lid 10 and the base 12 so as to face each other, a cavity 20 in which the vibrating arm 3 is oscillated is formed within the quartz crystal vibrator piece 1. The cavity 20 is kept in the high vacancy of about $10^{-3}$[Pa].

An exciting electrode 16 and an exciting electrode 17 are the electrodes to apply the voltage to the vibrating arm 3 and they are made of Al (aluminum) or an Al alloy metal (for example, Al and Cu (copper)) and deposited to the frame 2 and the vibrating arm 3 by spattering or the like.

In the meantime, as the electrode of the quartz crystal piece in the quartz crystal vibrator piece, Au is generally used, however, according to the present embodiment, Al is used in order to bond the lid 10 and the base 12 by using a so-called anodic bonding technique.

To explain it more in detail, Al can be anodic bonded to the glass at a relatively low temperature (about 200° [C.]) and its degree of electric conduction is high, so that a function as an electrode and a function as a bonding member to the glass are given to the exciting electrode 16 and the exciting electrode 17.

Thereby, the lid 10, the base 12, and the frame 2 are bonded and an airtight container is formed to encapsulate the vibrating arm 3 therein.

In the meantime, the anodic bonding is a bonding method employing a property that if a predetermined metal such as Al is brought into contact with a predetermined dielectric substance to be heated (about 200° [C.] to 400° [C.]) and a voltage about 500 [V] to 1 [kV] is applied thereto the metal forms a chemical union with the glass.

As the predetermined metal, there are Si (silicon), Mo (molybdenum), and Ti (titanium) or the like other than Al, and as the predetermined dielectric substance, there are glass and ceramic or the like.

By manufacturing the quartz crystal vibrator 9 using the anodic bonding, it is possible to obtain an advantage such as miniaturization, a high performance (if it is the same size, it is possible to house a larger quartz crystal vibrator piece 1 than other systems), and an excellent aging property (a less aged deterioration) or the like.

As a reason why the aged deterioration is less, it can be pointed out that no adhesive is used and there is no outgas from adhesives. Thereby, a high-temperature processing becomes possible, so that it is possible to remove any gas by heating the quartz crystal vibrator in advance and the emission of gas after manufacturing the product can be reduced.

The external electrode 13 and the external electrode 14 are formed at the opposite ends in a longitudinal direction at the base part of the base 12 to form the external terminals contacting the exciting electrode 16 and the exciting electrode 17.

The external electrode 13 is conducted to the exciting electrode 16 via the through hole 5 and the external electrode 14 is conducted to the exciting electrode 17.

Therefore, by applying the voltage of inverted polarities from the external electrode 13 and the external electrode 14, it is possible to apply the voltage of inverted polarities to the exciting electrode 16 and the exciting electrode 17.

If the voltage is applied to the exciting electrode 16 and the exciting electrode 17, the vibrating arm 3 is curved in an inner direction of the tuning fork shape or an outer direction (depending on its polarity) due to the piezoelectric effect, and if the voltage is released, the shape of the vibrating arm 3 is recovered. When it is recovered, the vibrating arm 3 generates the voltage of the inversed polarity due to the piezoelectric effect. Therefore, detecting this, the voltage that is inversed due to a negative feedback is applied to the vibrating arm 3.

By repeating the above-described process, it is possible to permanently oscillate the vibrating arm 3.

The quartz crystal vibrator 9 configured as above described is arranged on the printed board on which the solder has been mounted in advance by a mounter or the like so that the base 12 faces the printed board. Thereby, the external electrode 13 and the external electrode 14 are soldered and the quartz crystal vibrator 9 is disposed on the printed board.

Figure 3:
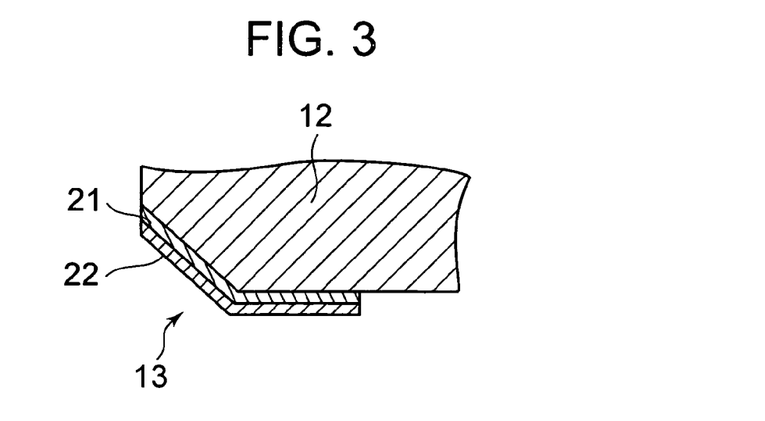
FIG. 3 is an enlarged view of an external electrode.

FIG. 3 is an enlarged view of the external electrode 13.

The external electrode 13 is of two-layer structure including a base metal 21 formed by a thin film of NiCr and a surface metal 22 formed by a thin film of Au.

These metals are deposited by spattering or the like.

The base metal 21 is deposited on the base 12. As a representative component ratio of Ni and Cr, Ni is 80 [%] and Cr is 20 [%] in weight.

In the meantime, this weight ratio is an example and it can be changed in accordance with applications. As a general tendency, as the ratio of Cr is high, the amount of Ni diffused in the solder in one soldering can be reduced and as the ratio of Ni is high, the stress becomes increased, however, the soldering property is improved.

As the ratio of Cr, 5% to 80% is appropriate. If Cr is less than 5%, the film stress is large and there is a possibility of damaging the glass. Therefore, in order to prevent the damage of the glass, decreasing the stress by reducing the thickness of the film of the base metal 21 may be considered. However, the function of reducing the dispersion of Ni into the solder by Cr is small, so that Ni is dispersed in the solder and it becomes difficult to solder again. In addition, if Cr exceeds 80%, the dispersion of Ni into the solder is reduced very much, which also makes it difficult to solder again. Accordingly, in the case that the ratio of Cr is less than 5% or exceeds 80%, such a ratio is not fit for the practical use in any case.

The surface metal 22 is deposited on the surface of the base metal 21. Ni (a predetermined metal) has a property that it is easily oxidized in air and if Ni is oxidized, this oxide film serves as a kind of protection film for the solder, so that the soldering becomes difficult. Therefore, in order to prevent oxidization of Ni, the surface metal 22 is formed.

The surface metal 22 is formed by Au and it is possible to prevent the oxidization of Ni and to secure a wet property of solder. In other words, the surface metal 22 forms an oxidation protection film that can be soldered.

In this way, the external electrode 13 forms a layer structure of glass-NiCr—Au.

If the external electrode 13 is soldered, by the first soldering, Au is dispersed in the solder to disappear.

Taking out this external electrode 13 in order to solder it again, the layer structure is glass-NiCr.

However, since the solder is attached to the surface of NiCr, this serves as oxidation protection film and Ni is not oxidized.

Next, trying to solder this again, it can be soldered by NiCr. In this case, a part of Ni is diffused in the solder.

However, since Ni is remained in NiCr yet, further, removing it, it is possible to solder again.

Depending on the component and the film thickness of NiCr, the external electrode 13 can be re-soldered two to ten times.

The structure of the external electrode 13 is described as above, however, the structure of the external electrode 14 is equal to that of the external electrode 13.

In addition, the surface metal 22 is not limited to Au but other metal, for example, platinum may be available.

Modified Example

Figure 4:
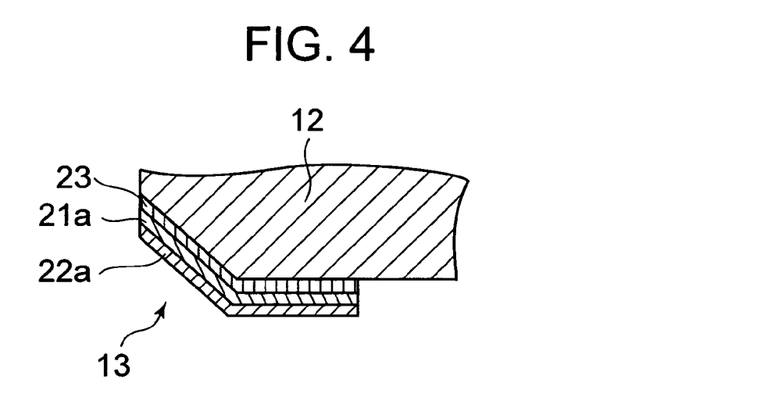
FIG. 4 is a view for explaining a modified example of the external electrode.

Next, using FIG. 4, a modified example of the external electrode 13 will be described.

According to this modified example, a base metal 23 is composed by coating Cr on the base 12, and above this, a base metal 21a formed by NiCr is disposed and further on this, a surface metal 22*a* made of Au is disposed. Thereby, the layer structure becomes glass-Cr—NiCr—Au.

In addition, the base metal 23 may be composed by Ti or Ta (tantalum). In this case, the layer structure becomes glass-Ti—NiCr—Au or glass-Ta—NiCr—Au.

By making the external electrode 13 into a three-layer structure in this way and making NiCr into an inner layer, even if NiCr is entirely diffused into the solder, the quartz crystal vibrator piece 1 can be conducted by the base metal 23. In addition, absorbing the stress of Ni by the base metal 23, the stress on the base 12 can be also reduced.

The structure of the external electrode 14 in the modified example is also the same as the external electrode 13.

As above, the embodiment and the modified example are described, however, a further modified example is available.

For example, according to the present embodiment, the quartz crystal vibrator 9 is configured by the glass package, however, it is also possible to employ the external electrode 13 and the external electrode 14 as the external electrodes of a ceramics package.

In the case of the ceramics package, it is manufactured by pasting the quartz crystal vibrator piece 1 between the lid 10 and the base 12 with adhesives.

In addition, it is also possible to make the structure of the surface metal 22 of the external electrode 13 and the external electrode 14 into a further multilayer.

By depositing the layer of Cr and that of Au, alternatively for example, as glass-NiCr—Au—Cr—Au—Cr—Au, it is possible to reduce the diffusion speed of Au into the solder.

In addition, according to the present embodiment, the piezoelectric vibrator piece is composed of a crystal, however, it is also possible to compose the piezoelectric vibrator piece from other materials, for example, ceramics.

From the present embodiment and the modified example that have been described above, the following effects can be obtained.

(1) It is possible to easily solder the surface mount type of quartz crystal vibrator piece again.

(2) By changing the component ratio of NiCr, it is possible to form the external electrode having a property in accordance with an object.

(3) Since the stress is reduced by making the base metal 21 into the thin film of NiCr, it is possible to prevent the damage of the glass due to the stress of Ni.

(4) It is possible to reduce the diffusion of Ni into the solder by Cr.

Next, an oscillator, which uses the surface mount type piezoelectric vibrator according to the above-described embodiment (hereinafter, a piezoelectric vibrator) as an oscillation piece and is connected to an integrated circuit, will be described.

Figure 5:
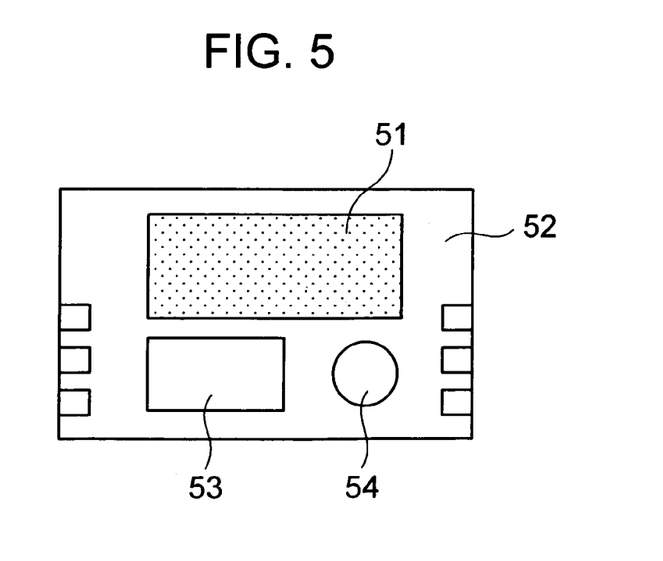
FIG. 5 is a plan view showing an example of the structure of a tuning fork type of quartz crystal oscillator using a tuning fork type of quartz crystal vibrator as a piezoelectric vibrator.

FIG. 5 is a plan view showing an example of the structure of a tuning fork type of quartz crystal oscillator using a tuning fork type of quartz crystal vibrator as a piezoelectric vibrator and shows the surface mount type piezoelectric oscillator using the tuning fork type of quartz crystal vibrator.

In FIG. 5, a tuning fork type of quartz crystal vibrator 51 is installed at a predetermined position of a base 52 and an integrated circuit (IC) for an oscillator is installed in adjacent to this quartz crystal vibrator. In addition, an electronic part 54 such as a capacitor is also mounted. These respective parts are electrically connected by a wiring pattern (not illustrated).

The mechanical oscillation of the vibrator piece of the quartz crystal vibrator 51 is transformed into an electric signal by the piezoelectric property of the crystal to be inputted in an integrated circuit 53. Within the integrated circuit 53, the signal processing is carried out and a frequency signal is outputted, and it functions as an oscillator. These respective components are molded by a resin (not illustrated).

Other than a single functional oscillator for a clock, the oscillator has a function to control the device and an operating date and time of external devices or to provide the time and the calendar information to a user by appropriately selecting the integrated circuit 53.

By mounting the piezoelectric vibrator according to the present embodiment as the oscillation piece in the base 52 together with the integrated circuit 53 and connecting it to the integrated circuit 53 to compose the oscillator, the piezoelectric vibrator can be detached from the base 52 in plural times. Accordingly, for example, in a developing step of these oscillators, the trial use of the piezoelectric vibrator or the like is made easier.

Next, an example of an electronic device in which the piezoelectric vibrator according to the present embodiment is connected to a clock part will be described. Here, as an example of the electronic device, a preferable embodiment of a portable information device represented by a cellular phone will be described in detail.

At first, as a premise, the portable information device according to the present embodiment is made by developing and improving a wrist watch according to the conventional art. The outline is similar to the wrist watch and a liquid crystal display is disposed at a portion equivalent to a dial window. On this screen, the current time or the like can be displayed.

When the portable information device is used as a communication instrument, removing it from the wrist, the same communication as the cellular phone of the conventional art can be made by a speaker and a microphone incorporated in the inner side of a band part. However, as compared to the conventional cellular phone, the portable information device is remarkably reduced in size and weight.

Next, the functional structure of the portable information device according to the present embodiment will be described with reference to the drawings.

Figure 6:
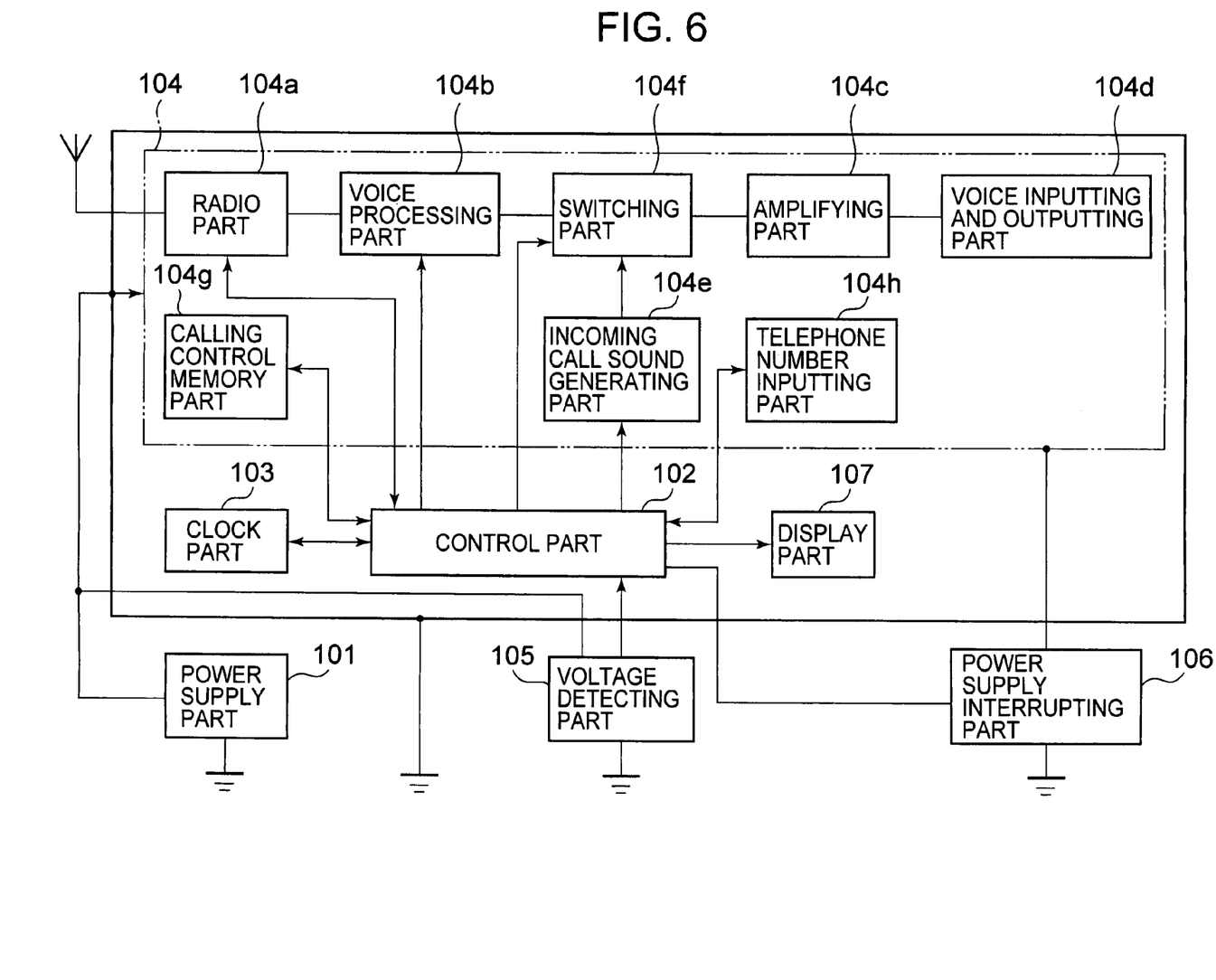
FIG. 6 is a block diagram functionally showing an example of the structure of a portable information device according to the present embodiment.

FIG. 6 is a block diagram functionally showing an example of the structure of the portable information device according to the present embodiment. In FIG. 6, a power supply part 101 is a power supply part to supply a power to each functional part to be described later, and specifically, it is realized by a lithium secondary battery.

To the power supply part 101, a control part 102, a clock part 103, a communication part 104, a voltage detecting part 105, and a display part 108 which will be described later are connected in parallel, and a power is supplied to each functional part from the power supply part 101.

The control part 102 controls each functional part to be described later and controls the operations of the entire system such as transmission and reception of the voice data and measurement and display of the current time. The control part 102 is specifically realized by a program that has been written in a ROM in advance, a CPU to read and execute the program, and a RAM or the like to be used as a work area of this CPU.

The clock part 103 is configured by an integrated circuit incorporating an oscillation circuit, a resister circuit, a counter circuit, and an interface circuit or the like therein and the tuning fork type of quartz crystal vibrator shown in FIG. 2.

The mechanical oscillation of the tuning fork type of quartz crystal vibrator is transformed into an electric signal by the piezoelectric property of the crystal to be inputted in an oscillation circuit formed by a transistor and a capacitor. The output of the oscillation circuit is binarized to be counted by the resistor circuit and the counter circuit. The transmission and the reception of the signal is carried out to and from the control part via the interface circuit, and on the display part 107, the current time, the current date or the calendar information are displayed.

The communication part 104 has the same function as the cellular phone according to the conventional art and it is configured by a radio part 104a, a voice processing part 104b, an amplifying part 104c, a voice inputting and outputting part 104d, an incoming call sound generating part 104e, a switching part 104f, a calling control memory part 104g, and a telephone number inputting part 104h.

The radio part 104a transmits and receives to and from a base station various data such as a voice data or the like via an antenna. The voice processing part 104b codes/decodes the voice signal inputted from the radio part 104a or the amplifying part 104c. The amplifying part 104c amplifies the signal inputted from the voice processing part 104b or the voice inputting and outputting part 104d to be described later into a predetermined level. Specifically, the voice inputting and outputting part 104d is a speaker and a microphone and it amplifies the incoming call sound and the Volume of the received voice sound and collects the voice of a speaker.

In addition, the incoming call sound generating part 104e generates an incoming call sound in accordance with calling from the base station. The switching part 104f makes the generated incoming sound to be outputted to the voice inputting and outputting part 104d via the amplifying part 104c only when the call is incoming by switching the amplifying part 104c connected to the voice processing part 104b into the incoming call sound generating part 104e.

In the meantime, the calling control memory part 104g houses a program with related to the control of the incoming call and the calling of the communication. In addition, the telephone number inputting part 104h is specifically composed of numeric keys from 0 to 9 and some other keys and a telephone number or the like of the intended party can be inputted.

When the voltage applied to each functional part including the control part 102 is below a predetermined value, the voltage detecting part 105 detects this voltage drop by the power supply part 101 and notifies the control part 102.

This predetermined voltage value is a value that has been set in advance as the minimum value required for stably operating the communication part 104 and for example, it is about 3V. Receiving the notification of the voltage drop from the voltage detecting part 105, the control part 102 inhibits the operations of the radio part 104a, the voice processing part 104b, the switching part 104f, and the incoming call sound generating part 104e. Particularly, the inhibition of the operation of the radio part 104a that requires the large power consumption is indispensable. At the same time, on the display part 107, it is displayed that the communication part 104 becomes unavailable due to lack of the remaining battery level.

Due to the actions of the voltage detecting part 105 and the control part 102, it is possible to inhibit the operation of the control part 104 and further, it is possible to display this to the display part 107.

As the present embodiment, by disposing a power supply interrupting part 106 that can selectively interrupt the power supply at a portion with related to the function of the communication part, the function of the communication part can be stopped in a more complete form.

In the meantime, the display meaning that the communication part 104 becomes unavailable may be executed by a character message, however, more viscerally, it may be carried out by marking X on an icon of a telephone on the display part 107 or the like.

By using the piezoelectric vibrator according to the present embodiment for the electronic device including the above-described portable information device, the piezoelectric vibrator can be detached in plural times, and for example, the trial use of the piezoelectric vibrator or the like is made easier in a developing step of these electronic devices.

Next, a radio clock, which uses the piezoelectric vibrator according to the above-described embodiment is connected to a filter part, will be described.

Figure 7:
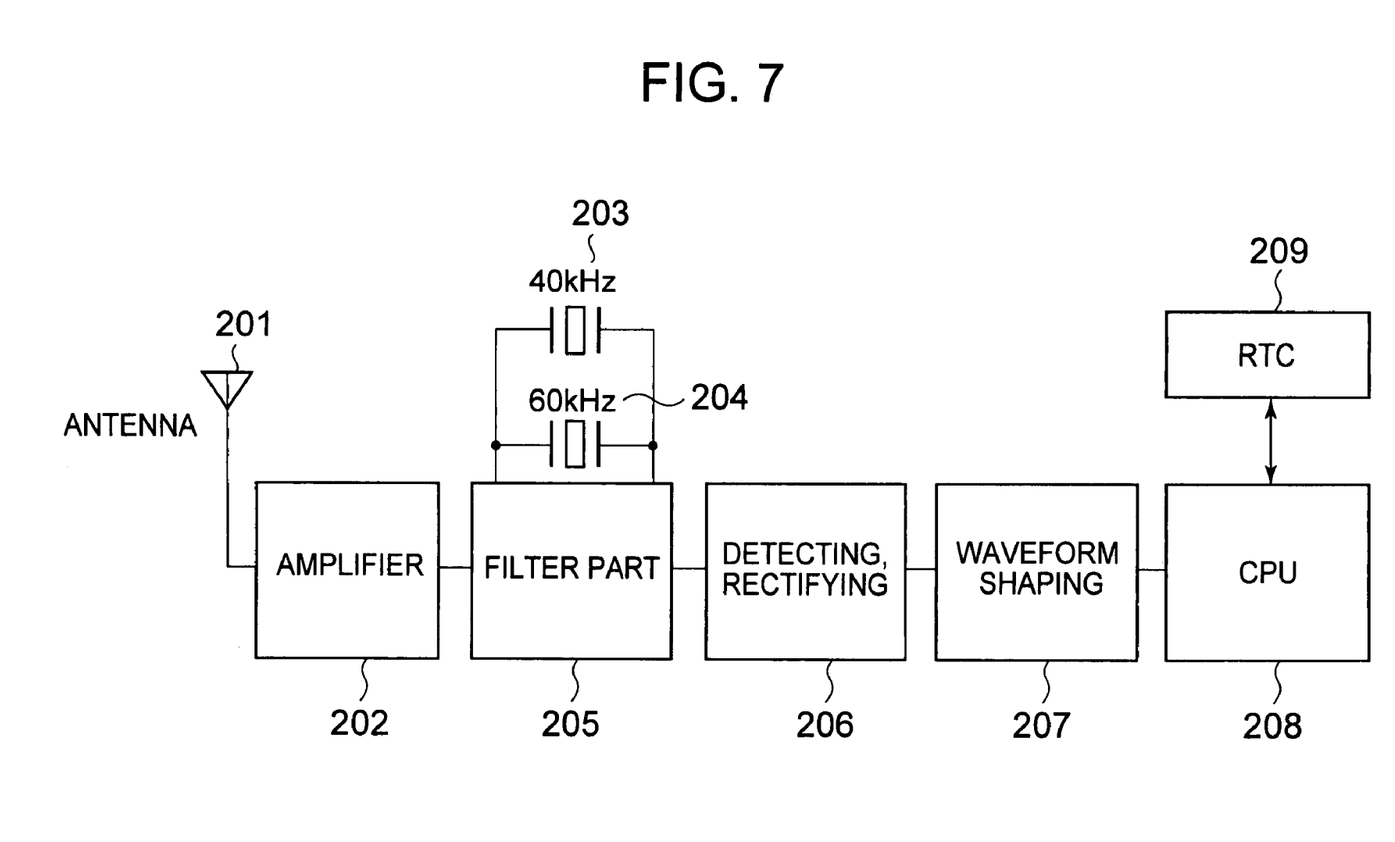
FIG. 7 is a schematic view showing a circuit block of an radio clock according to the present embodiment.

FIG. 7 is a schematic view showing a circuit block of a radio clock which constitutes an electronic equipment according to the present embodiment. The embodiment shows a case in which the piezoelectric vibrator of the present embodiment is connected to a filter part of the radio clock.

The radio clock is a clock which has a function of receiving the standard electric wave containing time information and displaying the time information by automatically correcting the time to an accurate time. In Japan, transmission stations (transmitting facilities) which transmit the standard electric waves are located in Fukushima prefecture (40 KHz) and Saga prefecture (60 KHz) and these transmission stations transmit the standard electric waves respectively. Long waves having frequency of 40 KHz or 60 KHz have a property that, the long waves are propagated on a surface of the earth and a property that the long waves are propagated while being reflected between an ionosphere and the surface of the earth and hence, the propagation range is broad whereby the long waves cover the whole Japan with the above-mentioned two transmission stations.

In FIG. 7, an antenna 201 receives the standard electric waves formed of the long waves of 40 KHz or 60 KHz. The standard electric waves formed of long waves are electric waves obtained by applying the time information referred to as a time code to the carrier wave of 40 KHz or 60 KHz using the AM modulation.

The received standard electric waves formed of long waves are amplified by an amplifier 202. Subsequently, the standard electric waves are filtered by a filter part 205 containing quartz crystal vibrators 203, 204 having the same resonance frequency as the carrier wave frequency and are synchronized with the carrier wave. The filtered signal of given frequency is detected and demodulated by a detecting and rectifying circuit 206. Then, the time code is taken out through a waveform shaping circuit 207 and is counted by a CPU 208. The CPU 208 reads out the information such as the current year, the accumulated days, date, time and the like. The read-out information is reflected on a RTC 209 and the accurate time information is displayed.

Since the carrier wave is 40 KHz or 60 KHz, it is preferable to use the above-mentioned vibrator having the tuning fork type structure as the quartz crystal vibrators 203, 204 which constitute the filter parts respectively. Taking the long waves of 60 KHz, for example, as a size example of the tuning fork type vibrator piece, it is possible to configure the vibrator such that the vibrator has a total length of approximately 2.8 mm and a width size of a base portion thereof is approximately 0.5 mm.

By using the piezoelectric vibrator according to the present embodiment for the radio clock connected to the filter portion, the piezoelectric vibrator can be detached in plural times, and for example, the trial use of the piezoelectric vibrator or the like is made easier in a developing step of these radio clock.

What is claimed is:
1. A surface mount type piezoelectric vibrator comprising:
a piezoelectric vibrator piece having an electrode;
an airtight container made of glass or a ceramic material for encapsulating the piezoelectric vibrator piece;

an external terminal comprised of a metal alloy of Ni and Cr formed on an exterior surface of the airtight container and connected to the electrode of the piezoelectric vibrator piece;
a film of Au formed on a surface of the metal alloy of Ni and Cr; and
a base metal made of one of Cr, Ti and Ta formed between the metal alloy of Ni and Cr and the exterior surface of the airtight container.

2. A surface mount type piezoelectric vibrator comprising:
a piezoelectric vibrator piece having an electrode;
an airtight container made of glass or a ceramic material for encapsulating the piezoelectric vibrator piece;
an external terminal comprised of a metal alloy of Ni and Cr formed on an exterior surface of the airtight container and connected to the electrode of the piezoelectric vibrator piece;
a film of Au formed on a surface of the metal alloy of Ni and Cr; and
a composite film of Cr and Au disposed on the film of Au formed on the surface of the metal alloy of Ni and Cr.

3. An oscillator comprising:
an integrated circuit; and
a surface mount type piezoelectric vibrator according to claim 1 or 2 connected to the integrated circuit.

4. An electronic device comprising:
a clock part; and
a surface mount type piezoelectric vibrator according to claim 1 or 2 connected to the clock part.

5. A radio clock comprising:
a filter portion; and
a surface mount type piezoelectric vibrator according to claim 1 or 2 connected to the filter portion.

6. A surface mount type piezoelectric vibrator according to claim 2; further comprising a plurality of composite films of Cr and Au disposed on the film of Au formed on the surface of the metal alloy of Ni and Cr.

7. An oscillator comprising:
an integrated circuit; and
a surface mount type piezoelectric vibrator connected to the integrated circuit, the surface mount type piezoelectric vibrator comprising
a piezoelectric vibrator piece having an electrode,
an airtight container made of glass or a ceramic material for encapsulating the piezoelectric vibrator piece,
an external terminal comprised of a metal alloy of Ni and Cr formed on an exterior surface of the airtight container and connected to the electrode of the piezoelectric vibrator piece,
a film of Au formed on a surface of the metal alloy of Ni and Cr, and
a plurality of composite films of Cr and Au disposed on the film of Au formed on the surface of the metal alloy of Ni and Cr.

8. An electronic device comprising:
a clock part; and
a surface mount type piezoelectric vibrator connected to the clock part, the surface mount type piezoelectric vibrator comprising
a piezoelectric vibrator piece having an electrode,
an airtight container made of glass or a ceramic material for encapsulating the piezoelectric vibrator piece,
an external terminal comprised of a metal alloy of Ni and Cr formed on an exterior surface of the airtight container and connected to the electrode of the piezoelectric vibrator piece,
a film of Au formed on a surface of the metal alloy of Ni and Cr, and
a plurality of composite films of Cr and Au disposed on the film of Au formed on the surface of the metal alloy of Ni and Cr.

9. A radio clock comprising:
a filter portion; and
a surface mount type piezoelectric vibrator connected to the filter portion, the surface mount type piezoelectric vibrator comprising
a piezoelectric vibrator piece having an electrode,
an airtight container made of glass or a ceramic material for encapsulating the piezoelectric vibrator piece,
an external terminal comprised of a metal alloy of Ni and Cr formed on an exterior surface of the airtight container and connected to the electrode of the piezoelectric vibrator piece,
a film of Au formed on a surface of the metal alloy of Ni and Cr, and
a plurality of composite films of Cr and Au disposed on the film of Au formed on the surface of the metal alloy of Ni and Cr.

10. A surface mount type piezoelectric vibrator comprising:
a piezoelectric vibrator piece having an electrode;
an airtight container that encapsulates the piezoelectric vibrator piece; and
an external terminal disposed on an exterior surface of the airtight container and connected to the electrode of the piezoelectric vibrator piece, the external terminal having a multi-layer structure comprised of a solderable metal alloy of Ni and Cr, a film of Au disposed on a surface of the solderable metal alloy, and a layer of Cr, Ti or Ta disposed between the exterior surface of the airtight container and the solderable metal alloy.

11. A surface mount type piezoelectric vibrator comprising:
a piezoelectric vibrator piece having an electrode;
an airtight container that encapsulates the piezoelectric vibrator piece; and
an external terminal disposed on an exterior surface of the airtight container and connected to the electrode of the piezoelectric vibrator piece, the external terminal having a multi-layer structure comprised of a solderable metal alloy a film of Au disposed on a surface of the solderable metal alloy and at least one composite film of Cr and Au disposed on the film of Au.

12. A surface mount type piezoelectric vibrator according to claim 11; wherein the at least one composite film of Cr and Au comprises a plurality of composite films of Cr and Au.

* * * * *